(12) United States Patent
Motta et al.

(10) Patent No.: US 7,013,378 B2
(45) Date of Patent: Mar. 14, 2006

(54) METHOD AND SYSTEM FOR MINIMIZING THE LENGTH OF A DEFECT LIST FOR A STORAGE DEVICE

(75) Inventors: Giovanni Motta, Waltham, MA (US); Erik Ordentlich, San Jose, CA (US); Gadiel Seroussi, Cupertino, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 315 days.

(21) Appl. No.: 10/427,526

(22) Filed: Apr. 30, 2003

(65) Prior Publication Data
US 2004/0221192 A1 Nov. 4, 2004

(51) Int. Cl.
G06F 12/16 (2006.01)
(52) U.S. Cl. .............. 711/203; 711/100; 711/154; 711/200; 714/8
(58) Field of Classification Search ........... 711/100, 711/154, 200, 203; 714/8
See application file for complete search history.

(56) References Cited

U.S. PATENT DOCUMENTS

| | | | | |
|---|---|---|---|---|
| 5,394,534 A | * | 2/1995 | Kulakowski et al. | 711/112 |
| 5,438,559 A | * | 8/1995 | Best et al. | 369/53.29 |
| 5,500,848 A | * | 3/1996 | Best et al. | 369/275.3 |
| 5,960,465 A | * | 9/1999 | Adams | 711/208 |
| 5,966,263 A | * | 10/1999 | Freitas et al. | 360/69 |
| 6,138,254 A | * | 10/2000 | Voshell | 714/710 |
| 6,202,179 B1 | * | 3/2001 | Morzano | 714/710 |
| 6,269,455 B1 | * | 7/2001 | Deas | 714/29 |
| 6,381,669 B1 | * | 4/2002 | Chudnovsky et al. | 711/5 |
| 6,470,461 B1 | * | 10/2002 | Pinvidic et al. | 714/8 |
| 6,842,874 B1 | * | 1/2005 | Voshell | 714/723 |

OTHER PUBLICATIONS

Technique for using compressed bit-map for memory utilization; Apr. 1991, Kenneth Mason Publication, 2 pages.*

* cited by examiner

Primary Examiner—Tuan V. Thai

(57) ABSTRACT

A number of methods and systems for efficiently storing defective-memory-location tables. A asymmetrical-distortion-model vector quantization method and a run-length quantization method for compressing a defective-memory-location bit map that identifies defective memory locations within a memory are provided. In addition, because various different compression/decompression methods may be suitable for different types of defect distributions within a memory, a method is provided to select the most appropriate compression/decompression method from among a number of compression/decompression methods as most appropriate for a particular defect probability distribution. Finally, bit-map compression and the figure-of-merit metric for selecting an appropriate compression technique may enable global optimization of error-correcting codes and defective memory-location identification.

18 Claims, 14 Drawing Sheets

Figure 7

|      | 0000 | 0001 | 0010 | 0011 | 0100 | 0101 | 0110 | 0111 | 1000 | 1001 | 1010 | 1011 | 1100 | 1101 | 1110 | 1111 |
|------|------|------|------|------|------|------|------|------|------|------|------|------|------|------|------|------|
| 0000 | 0000 | 0001 | 0010 | 0011 | 0100 | 0101 | 0110 | 0111 | 1000 | 1001 | 1010 | 1011 | 1100 | 1101 | 1110 | 1111 |
| 0001 |      | 0001 |      | 0011 |      | 0101 |      | 0111 |      | 1001 |      | 1011 |      | 1101 |      | 1111 |
| 0010 |      |      | 0010 | 0011 |      |      | 0110 | 0111 |      |      | 1010 | 1011 |      |      | 1110 | 1111 |
| 0011 |      |      |      | 0011 |      |      |      | 0111 |      |      |      | 1011 |      |      |      | 1111 |
| 0100 |      |      |      |      | 0100 | 0101 | 0110 | 0111 |      |      |      |      | 1100 | 1101 | 1110 | 1111 |
| 0101 |      |      |      |      |      | 0101 |      | 0111 |      |      |      |      |      | 1101 |      | 1111 |
| 0110 |      |      |      |      |      |      | 0110 | 0111 |      |      |      |      |      |      | 1110 | 1111 |
| 0111 |      |      |      |      |      |      |      | 0111 |      |      |      |      |      |      |      | 1111 |
| 1000 |      |      |      |      |      |      |      |      | 1000 | 1001 | 1010 | 1011 | 1100 | 1101 | 1110 | 1111 |
| 1001 |      |      |      |      |      |      |      |      |      | 1001 |      | 1011 |      | 1101 |      | 1111 |
| 1010 |      |      |      |      |      |      |      |      |      |      | 1010 | 1011 |      |      | 1110 | 1111 |
| 1011 |      |      |      |      |      |      |      |      |      |      |      | 1011 |      |      |      | 1111 |
| 1100 |      |      |      |      |      |      |      |      |      |      |      |      | 1100 | 1101 | 1110 | 1111 |
| 1101 |      |      |      |      |      |      |      |      |      |      |      |      |      | 1101 |      | 1111 |
| 1110 |      |      |      |      |      |      |      |      |      |      |      |      |      |      | 1110 | 1111 |
| 1111 |      |      |      |      |      |      |      |      |      |      |      |      |      |      |      | 1111 |

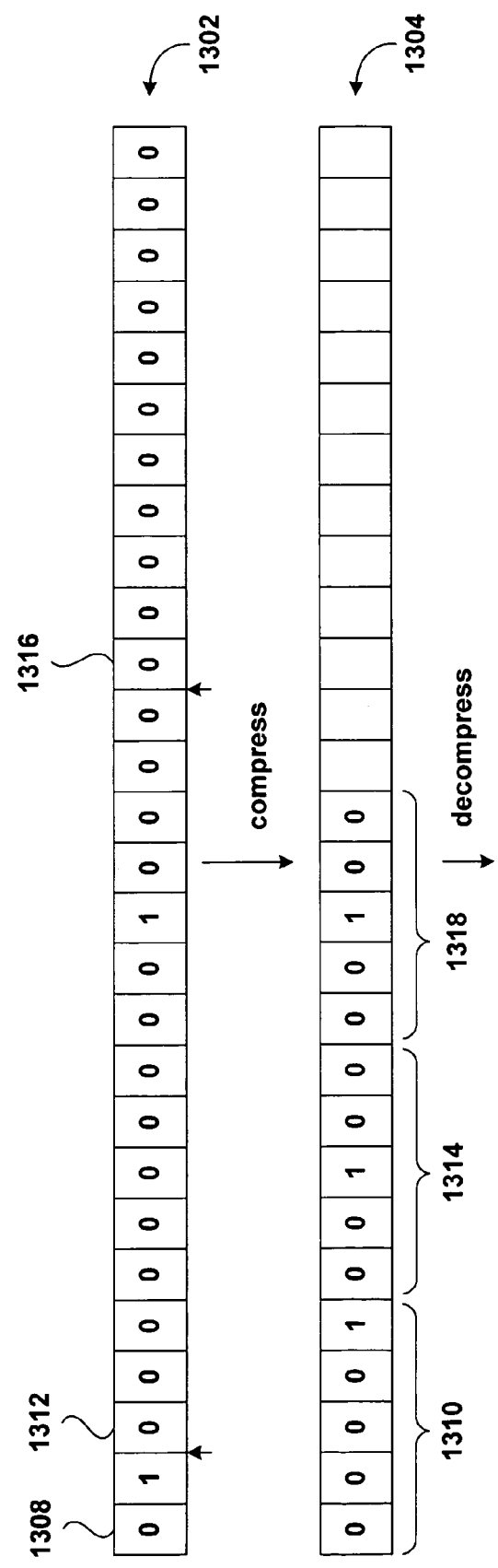

METHOD AND SYSTEM FOR MINIMIZING THE LENGTH OF A DEFECT LIST FOR A STORAGE DEVICE

TECHNICAL FIELD

The present invention relates to data-storage devices, or memories, and, in particular, to defective-data-storage-locations tables associated with data-storage devices, or defective-memory-location tables associated with memories, that identify all defective memory locations so that a sequential list of logical memory locations indexed with monotonically increasing indices can be created from a memory that includes a number of defective physical memory locations.

BACKGROUND OF THE INVENTION

Enormous strides have been taken in recent years to develop new technologies for storing data into data-storage devices, or memories. High density and high capacity electronic memory chips have become readily and inexpensively available, and newer, three-dimensional, stacked electronic memory devices have been developed using semiconductor films. Older technologies include magnetic disks, magnetic tapes, and very old core memories and drum memories. Electronic and magnetic memory devices generally comprise a very large number of addressable physical memory locations, each physical memory location capable of storing one or more computer-readable bytes or words composed of a fixed number of bits, such as 8-bit bytes and 32-bit words or 64-bit words. The lowest-level units of storage, generally referred to as "data-storage units," may be hierarchically grouped into larger units, such as disk sectors or three-dimensional memory planes. A physical memory location comprises one or more data-storage units that can be addressed by a physical address. A physical memory location may be a computer-readable word on one type of memory device, and a disk sector on another type of device.

In general, regardless of the technology, a certain number of the memory locations within a memory device may be defective. A defective memory location may be unreadable, or may be unreliable, producing different values when successively read without intervening write. Such defective memory locations may be identified in initial testing following manufacture, or may be dynamically identified over the lifetime of the memory device, or via incremental testing of the memory device, or by other means.

FIG. 1 shows an illustration of a three-dimensional memory. The memory comprises nine planes 101–109, each plane comprising a grid-like array of memory locations, such as memory location 110. In the three-dimensional memory device shown in FIG. 1, the memory locations on each plane are indexed like the cells in a mathematical array, starting with the memory location (0, 0) and proceeding, row by row, to memory location (31, 5). The planes may be indexed by a third index, so that each memory location specified by coordinates (x, y, z), for example, where x is the index of a row within a plane, y is the index of a column within a plane, and z is the index of a plane within the stack of planes that composes the 3-dimensional memory. In FIG. 1, a number of memory locations, or words, such as memory location 112, are shaded to indicate that the memory location is defective.

FIG. 2 illustrates one of numerous possible techniques for addressing non-defective memory locations within a memory that includes defective memory locations, such as that shown in FIG. 1. As shown in FIG. 2, a bit map 201 may be constructed to mirror the structure of the physical memory locations within the memory. For example, as shown in FIG. 2, the bit map 201 includes an array of bits, such as array 203, corresponding to each plane of the three-dimensional memory shown in FIG. 1. In each bit array, a cell, such as cell 205, includes a single bit indicating whether or not the corresponding memory location is non-defective or defective. In this figure, and in the following discussion, the bit value "0" indicates a non-defective physical memory location and the bit value "1" indicates a defective physical memory location. Note that the bit array 203 in FIG. 2 is indexed similarly to the indexing of the memory locations within the corresponding three-dimensional memory plane 101 in the memory shown in FIG. 1. The correspondence between the defective bits, shown as shaded cells in FIG. 1, and bit-value-"1"-containing cells in the bit array 203 is readily apparent.

Once a defective-memory-location map, such as the bit map 201 in FIG. 2, is prepared, the non-defective memory locations can be sequenced in monotonically increasing order by ignoring those memory locations verified as defective in the bit map. In other words, a sequence of logical, non-defective memory locations can be prepared, so that physical memory locations can be addressed using logical memory locations that are non-defective. One way to do this is to create an index 207 of the logical-memory-location address of each of the physical memory locations corresponding to the bit-map entries in the first row 209 of the bit map array. One may create a separate index, such as index 207, for each bit array corresponding to a plane in the memory. The index can be used to find a memory location close to, and preceding, a desired memory location, and then the corresponding column of the bit array can be traversed in order to find the exact physical address of the memory location within the memory. For example, if one wishes to find the physical memory location with logical memory-location address 100, one could search the index 207 to locate the cell 212 containing the logical memory-location address "98." The index in that cell is the index of the column within the bit array having a first cell corresponding to the logical memory-location address. Thus, cell 214 within bit array 203 corresponds to a memory location having logical memory-location address "98." Then, the column can be traversed downward, cell by cell, to locate the bit-array cell 216 corresponding to the logical memory-location address "100." During the traverse, any bit-array cells containing the bit value "1" are skipped. Note that the difference between the contents of successive cells within the index 207 is not constant. If there are no defective memory locations within the column of a plane of the memory corresponding to a column of the bit array, then the next cell in the index is incremented by the number of cells in a column of the bit array. For example, the value "6" in the second cell 218 of the index 207 indicates that no defective memory locations occur in the first column of the first plane of the memory. However, because of the occurrence of a defective memory location in the second column of the first plane of memory (114 in FIG. 1), identified by the bit value "1" in cell 220 of the bit array 203, the value in the third cell of the index 207 222 is "11," only five greater than the preceding value.

The index and memory-location bit map (207 and 201 in FIG. 2, respectively) represent one of many different possible methods for sequentially indexing the non-defective memory locations within a memory. Common to most methods is a bit map, such as bit map 201 in FIG. 2, in which the non-defective and defective memory locations within the memory are identified. This bit map needs to be stored in a very high-speed memory to facilitate efficient and high-speed addressing of a memory, because the bit map may need to be accessed every time a memory location is accessed. However, such high-speed memories are much more expensive than commonly employed lower-speed memories. For example, high-speed registers within a processor are generally much more quickly accessed, but are many orders of magnitude more expensive, than the lower-speed dynamic random access memories generally interconnected with the processor via one or more memory busses. Although faster operation can be obtained by including a larger number of registers within a processor, the processor becomes increasingly expensive with each added register. For these reasons, a method for efficiently storing memory-location bit maps, such as the memory-location bit map 201 shown in FIG. 2, has been recognized by manufacturers and designers of memories and by the manufacturers and users of devices that contain those memories.

SUMMARY OF THE INVENTION

In a general method that represents a set of embodiments of the present invention, a defective-memory-location bit map is compressed using a lossy compression/decompression method. A lossy compression/decompression method may alter compressed information upon decompression, but may result in greater compression. One particular embodiment of the present invention uses a vector quantization technique to compress a defective-memory-location bit map that identifies defective memory locations within a memory. The vector quantization method uses an iterative partitioning of a vector space. Partitioning employs a Boolean OR metric for determining the affinities of vectors for each codeword selected as the initial vector for each nascent partition. The special vector (1,1 . . . 1) is maintained as a codeword within the codebook over all iterations. The vector quantization method is designed to produce asymmetrical distortion, so that a defective memory location is not distorted, through compression and decompression, to incorrectly indicate that the memory location is good. Only distortions that relegate good memory locations to defective-memory-location indications within the defective-memory-location bit map are permitted, resulting in a loss of memory locations, but preventing a defective memory location from being relied on. Because various different compression/decompression methods may be suitable for different types of defect distributions within a memory, a method is provided to select the most appropriate compression/decompression method from among a number of compression/decompression methods as most appropriate for a particular defect probability distribution. A run-length quantization method may also be employed to compress a defective-memory-location bit map.

BRIEF DESCRIPTION OF THE DRAWINGS

FIGS. 4–9 illustrate a vector quantization method for compressing defective-memory-location bit maps that represents one embodiment of the present invention.

FIGS. 12 and 13 illustrate the run-length quantization compression/decompression method that represents one embodiment of the present invention.

DETAILED DESCRIPTION OF THE INVENTION

In order to store a bit map representing defective memory locations within a memory as compactly as possible within a high-speed memory, to minimize the amount of high-speed memory needed in order to implement the memory, a number of embodiments of the present invention compress the defective-memory-location table that indicates which physical memory locations are defective, and store the compressed defective-memory-location table in high-speed memory. As discussed above, defective-memory-location tables are commonly bit maps, in which the bit value "0" is used to indicate non-defective memory locations, while the bit value "1" is used to designate defective memory locations. Of course, an opposite convention may also be used.

Figure 1:
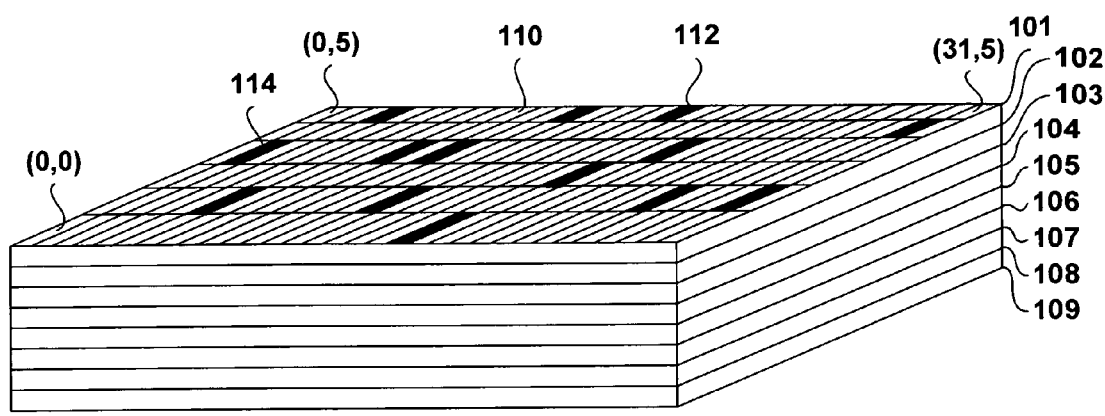
FIG. 1 shows an illustration of a three-dimensional memory.
Figure 2:
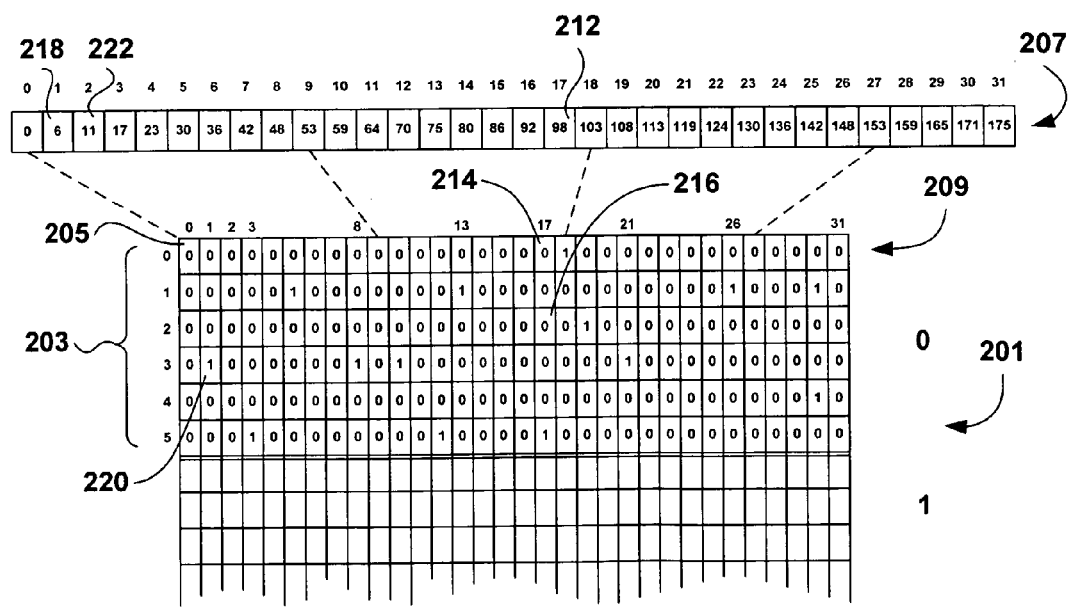
FIG. 2 illustrates one of numerous possible techniques for addressing non-defective memory locations within a memory that includes defective memory locations, such as that shown in FIG. 1.
Figure 3A:
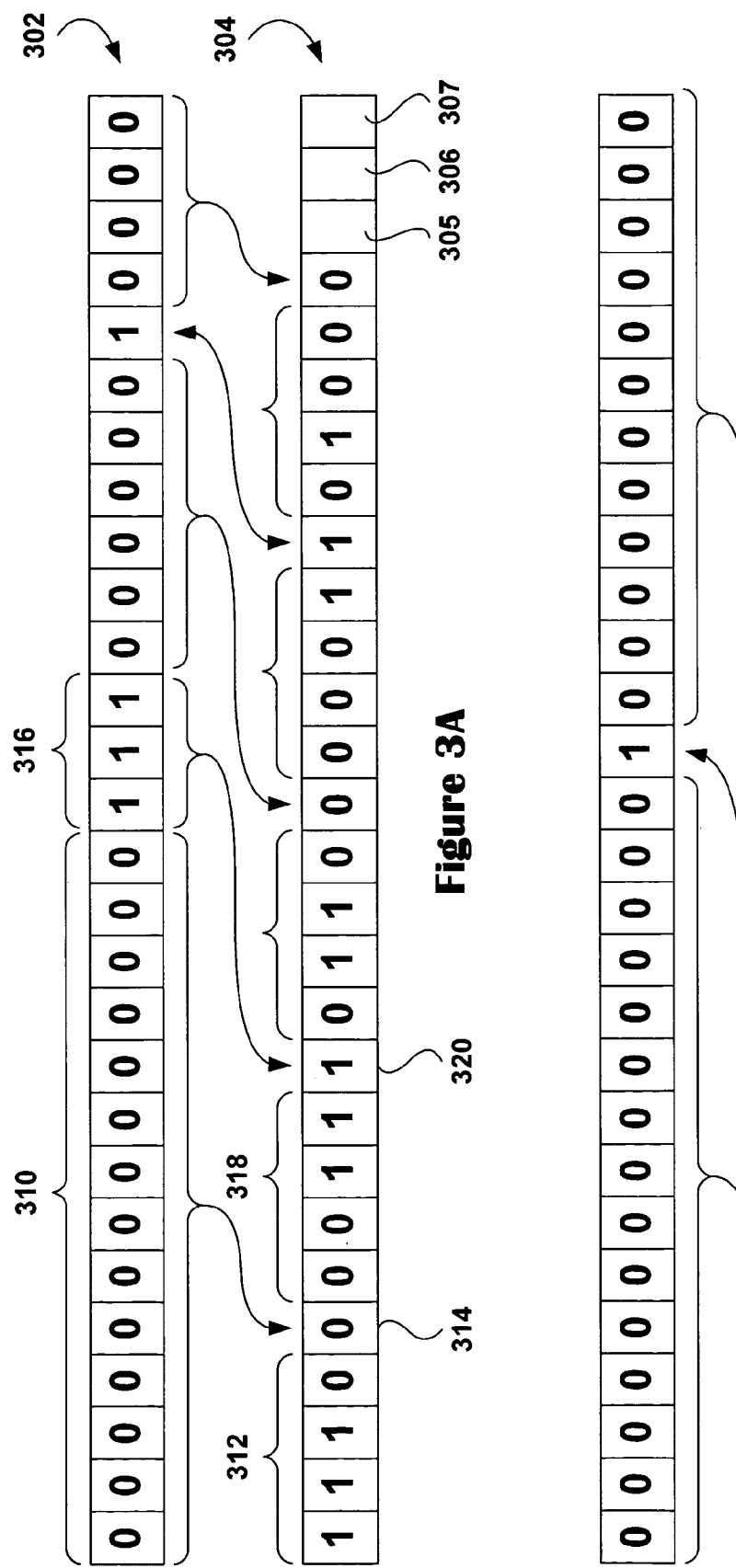
FIGS. 3A–C illustrate the run-length encoding technique.
Figure 3B:
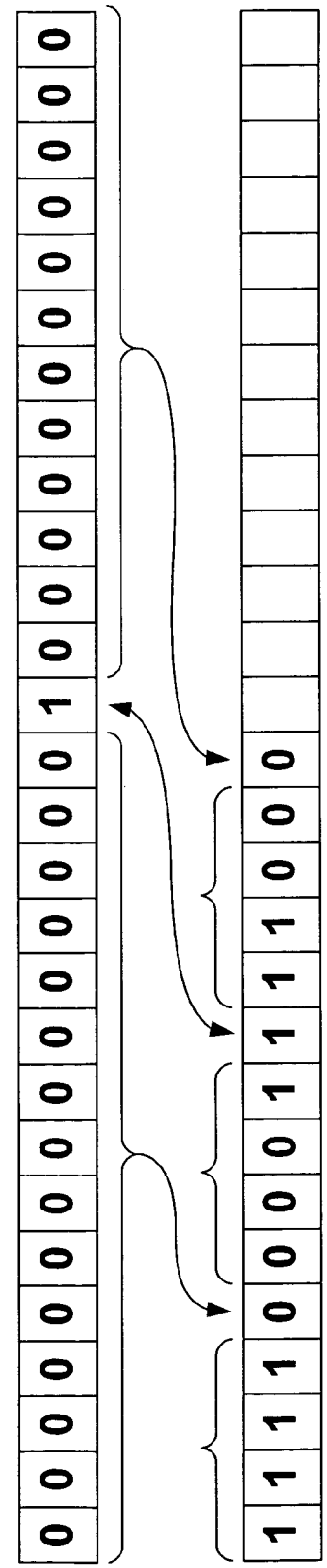
Figure 3C:
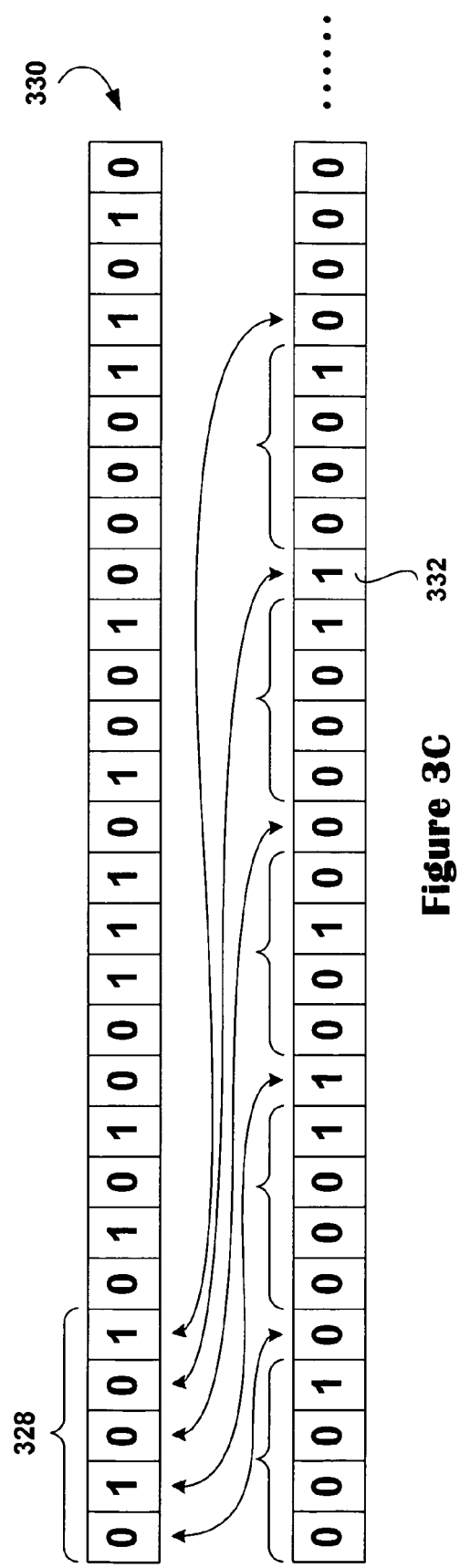

There are many different types of compression techniques. These types fall into two general categories: (1) non-loss compression techniques that enable exact reconstruction of a compressed bit map; and (2) lossy compression techniques, which generally produce distortions with respect to the originally encoded bit map upon decompression. A well-known, non-loss compression technique is known as "run-length encoding." FIGS. 3A–C illustrate the run-length encoding technique. Note that, regardless of the structure of a memory, all of the memory locations within a memory may be sequentially ordered, so that the bit map that indicates which of the memory locations are defective may also be sequential. In FIG. 3A, a short defective-memory-location bit map 302 is shown, along with a compressed version of the bit map 304. This compression is not terribly dramatic, in the example shown in FIG. 3A, since the compressed bit map 304 is shorter than the uncompressed bit map 302 by only three bits, shown as the tail blank bits 305–307 in FIG. 3A. The bit map 302 is encoded, or compressed, via run-length encoding. In this technique, strings of sequential zero bits and strings of sequential one bits are represented by a length of the string followed by the bit value of the bits within the string. For example, bit map 302 includes a leading string of 14 zero bits 310. This string of 14 zero bits is represented, in the compressed version of the bit map 304, as a four-bit integer 312 representing the value "14" followed by a single bit value "0" 314 indicating that the bits within the 14-bit string are zero bits. Similarly, the next string of three one bits 316 in the uncompressed bit map 302 is represented in the compressed bit map by the four-bit integer 318 representing the value "3" followed by a single bit 320 having bit-value "1," indicating that the string of three bits have bit values of "1." Run-length encoding is a non-loss encoding technique, because the original bit map 302 can be exactly reconstructed from the compressed version of the bit map 304. Each sub-string of the uncompressed bit map can be generated from the compressed bit map, in order, starting from the left-most substring representation in the compressed version of the bit map. As shown in FIG. 3B, significantly greater compression ratios are obtained when only a relatively few memory locations are defective. In the example shown in FIG. 3B, an almost 50 percent compression is achieved. When larger run-length integers are employed, for example, 32-bit integers, and the occurrence of defects is quite rare, still greater compression ratios can be achieved. However, as shown in FIG. 3C, non-loss compression techniques may not always produce compression, but may, for certain input bit maps, produce compressed bit maps of greater lengths than the original uncompressed bit map. In other words, non-loss compression techniques can fail spectacularly for certain types of defect distributions. In FIG. 3C, there is a relatively high proportion of defective memory locations, and the defective memory locations are interspersed with non-defective memory locations. In this case, run-length compression of only the first six bits 328 of the uncompressed bit map 330 produces 28 bits of run-length encoded bit map within the compressed version of the bit map 332. Thus, in this case, run-length encoding results in data expansion rather than data compression. Alternatively, a variable-length, rather than fixed-length, run-length encoding technique can be employed. In a variable-length encoding technique, a variable length prefix-free code may be used to encode the run-length values into sequences of variable-length bit strings. The sizes, in bits, of run-length encodings generally reflect the frequency of occurrence of the encodings, so that the most frequently occurring run lengths are most concisely encoded. Various different types of variable-length run-length encodings can be used to adapt the encoding to a statistical model of the data to be compressed, in order to compress the data as efficiently as possible.

One embodiment of the present invention involves the use of vector quantization to compress a defective-memory-location bit map. Vector quantization is a lossy compression technique. It would not be obvious to use a lossy compression technique for compressing memory-location-defect bit maps, because, upon decompression, the original defective-memory-location bit map may be distorted, meaning that bits having bit values "0" in the original bit map may be distorted to have bit values "1" in the decompressed version, and bits having bit values "1" may be distorted to have bit values "0" in the decompressed version of the defective memory-location bit map. In the former case, a non-defective memory location is considered to be defective, representing the waste of a non-defective memory location within the memory. In the latter case, a recognized defective memory location is considered to be non-defective, which may result in errors of various severities, including catastrophic errors. Thus, lossy compression techniques might be reasonably viewed as unacceptable. However, the recognition that a compression/decompression technique that produces an asymmetrical distortion may be acceptable for compressing defective-memory-location bit maps served as a motivation for the first embodiment of the present invention.

Figure 4:
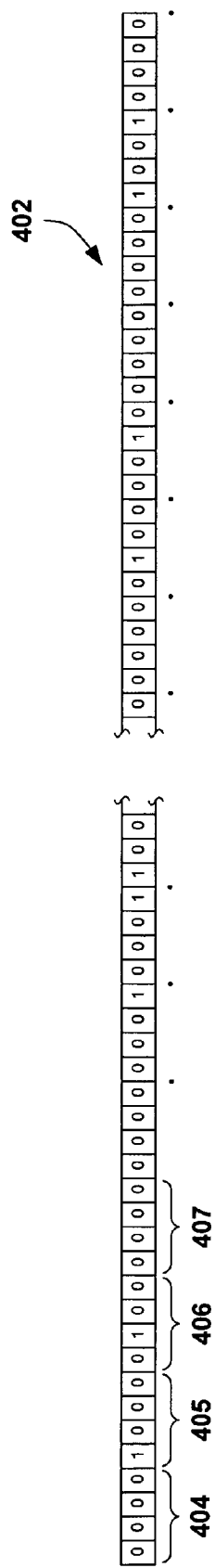

FIGS. 4–9 illustrate a vector quantization method for compressing defective-memory-location bit maps that represents one embodiment of the present invention. As shown in FIG. 4, a defective-memory-location bit map 402 may be divided into a sequence of bit vectors 404–407. In other words, the defective-memory-location bit map 402 can be considered to be, as shown in FIG. 4, a sequence of four-bit bit vectors. Vector quantization is a process for compressing each of the sequential vectors into an index. Decompression of a bit map compressed via vector quantization involves transforming a sequence of indices back into bit vectors.

Figure 5:
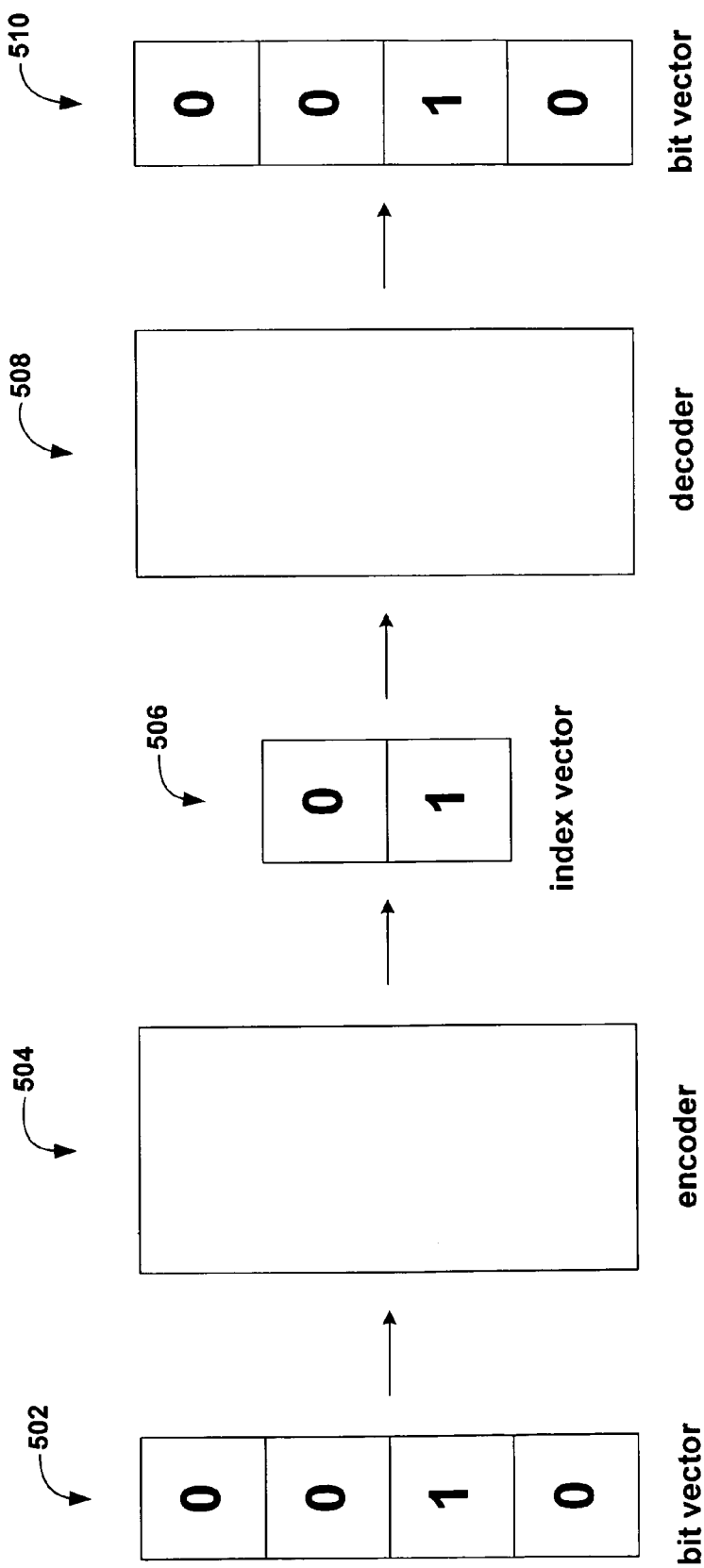

FIG. 5 illustrates the transformation of a bit vector via vector quantization into an index vector, and subsequent reconstruction of the bit vector. As shown in FIG. 5, a bit vector 502 representing one of the sequential bit vectors in an input bit map is transformed by an encoder 504 to an index vector 506. The index vector is shorter than the bit vector, thus producing a compression ratio of the input bit map equal to the ratio of the length of the bit vector to the length of the index vector. The index vector 506 is the index of a codeword within a codebook, to be described below. Reconstruction of a bit map from a sequence of index vectors involves passing the index vectors through a decoder 508 to produce a corresponding vector 5 10. The decoder employs the index to locate the corresponding codeword, and produces the codeword as the output bit vector.

Figure 6:
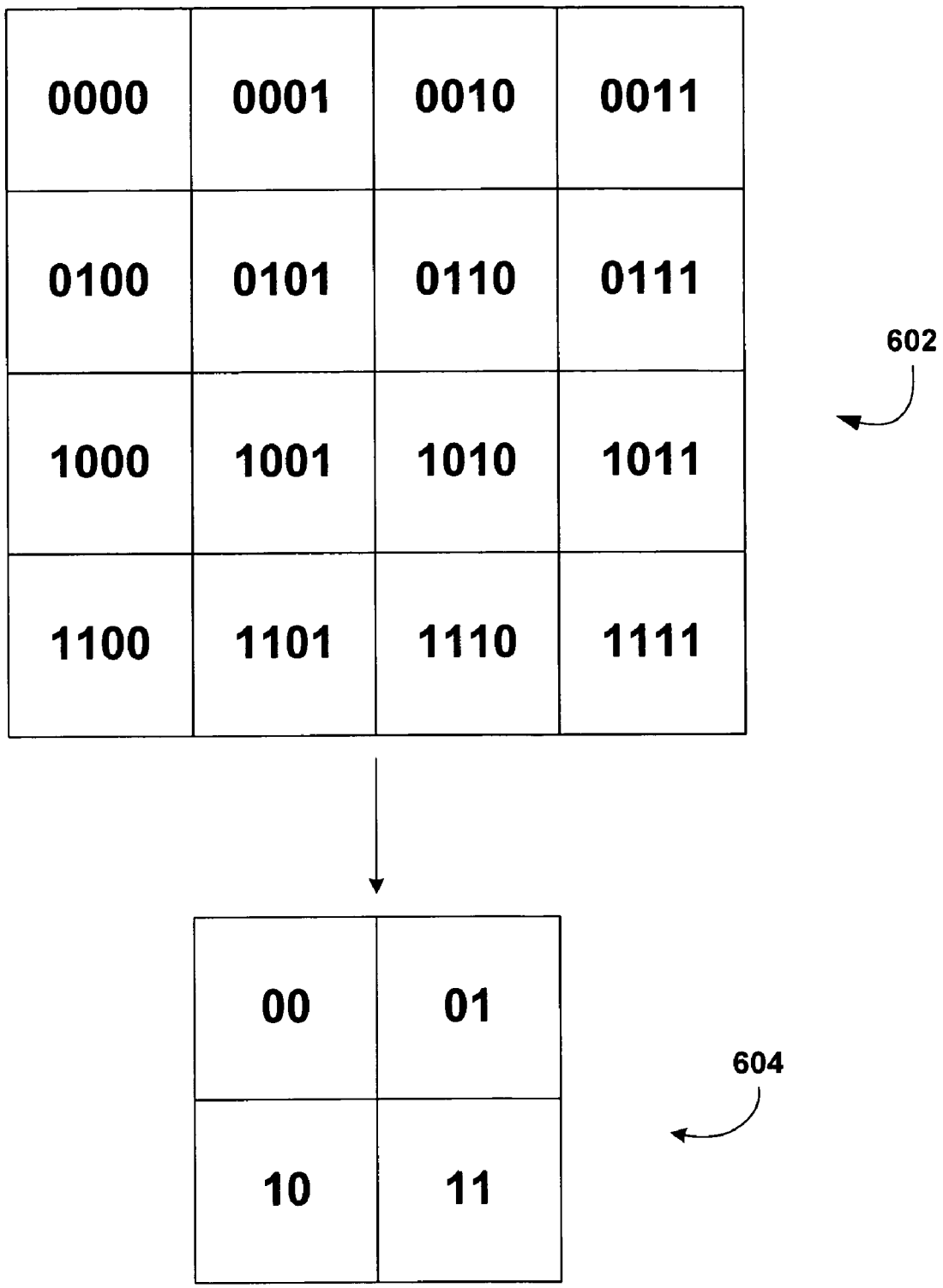

FIG. 6 shows an example bit-vector space and a corresponding index-vector space. As shown in FIG. 6, if four-bit input vectors are employed, 16 different possible input vectors 602 may be received by a vector-quantization encoder. If the encoder employs a codebook containing four codewords, then four different indices are required in order to index the codebook. Thus, two-bit index vectors can be used to index the four codewords within the codebook. Thus, as shown in FIG. 6, four-bit bit vectors are transformed by vector-quantization encoding into two-bit index vectors 604.

As with run-length encoding, vector-quantization techniques may also encode indexes into binary strings using a lossless variable length prefix-free code. By doing so, the most commonly referenced codewords can be indexed with greater conciseness, while less frequently referenced codewords may be indexed with longer indexes. When there is a non-constant frequency-of-reference distribution, greater encoding efficiency may be obtained using variable-length indexes.

As noted above, an asymmetrical vector-quantization method must be devised for compressing defective-memory-location bit maps. FIG. 7 shows a table illustrating the different codewords that might be used to represent each of the 16 different possible four-bit input vectors. The 16 different possible four-bit input vectors are shown as labels 702 of 16 columns, such as column 704, in table 700 of FIG. 7. The four-bit values in each column represent the different possible codewords that may correspond to the particular four-bit input vector that labels the column. For example, the input vector "0100" 706 may be represented by any of codewords "0100," "0101," "0110," "0111," "1100," "1101," "1110," and "1111." No other codeword is possible, because a codeword for the four-bit bit vector "0100" cannot contain a bit value "0" in any of the bit positions in which the input vector has a bit value "1." In other words, an indication of a defective memory location may not be distorted to an indication of a non-defective memory location. Note that the only codeword possible for input vector "1111" 708 is the codeword "1111," and note also that any codeword can be used for input vector "0000." Because the only codeword possible for input vector "1111" is codeword "1111," the codeword "1111" needs to be in each possible codebook in order to prevent undesirable distortion.

Figure 8:
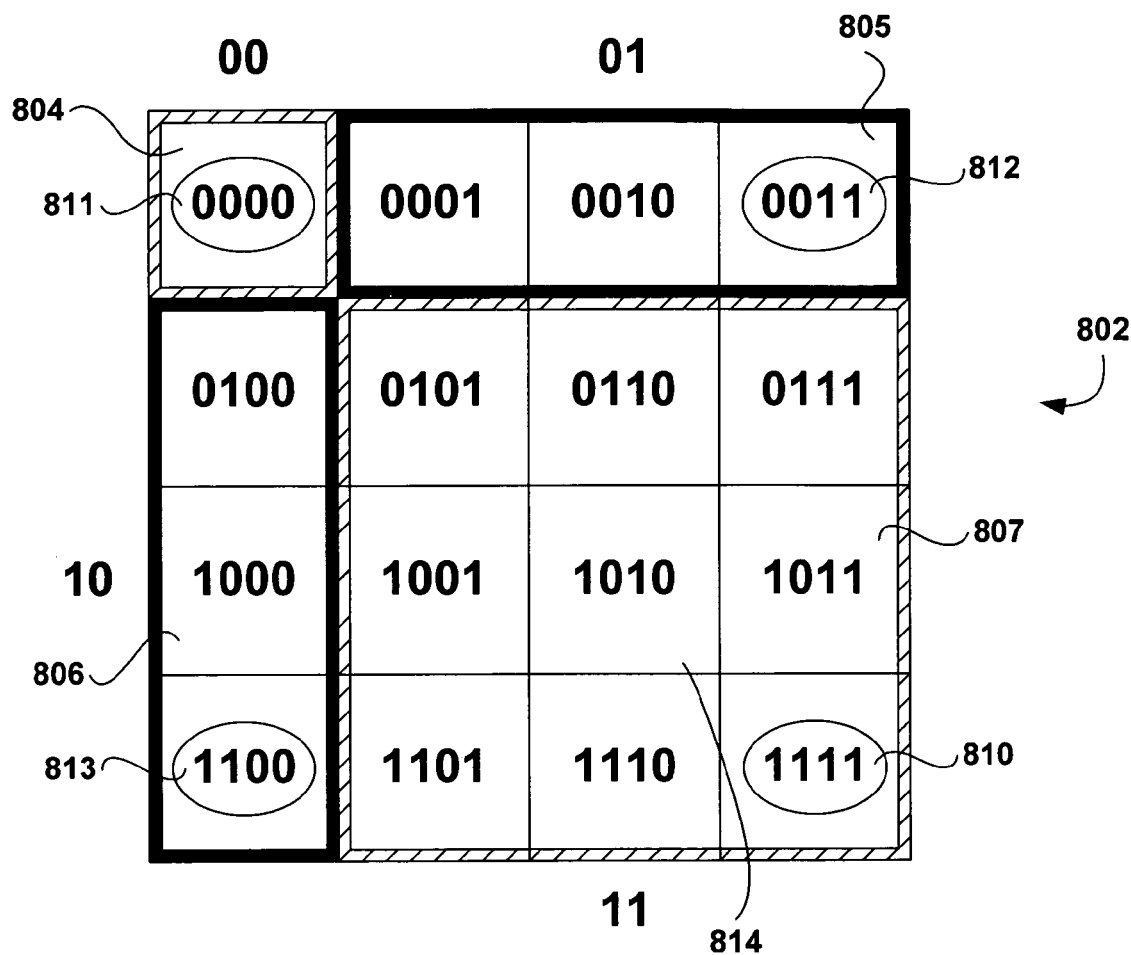

FIG. 8 represents a possible vector-quantization scheme for four-bit input vectors and two-bit index vectors that index a codebook containing four codewords. The large rectangle 802 in FIG. 8 shows all different possible input vectors. The possible input vectors are partitioned, in FIG. 8, into four groups 804–807. The first group, or partition 804, includes only the input bit vector "0000." The second partition 805 includes the input bit vectors "0001," "0010," and "0011." The third partition 806 includes the bit vectors "0100," "1000," and "1100." The fourth partition 802 includes the remaining possible input vectors. The circled vector in each partition, such as circled vector 810, is the codeword for the partition. There are four codewords 810–813 for the four partitions. The four codewords are indexed in order of the magnitudes of the codewords when viewed as 4-bit integers. Thus, a vector-quantization compression technique employing the scheme of FIG. 8 would compress input vector "0000" of partition 804 into the index vector "00" that represents the index for the codeword 811 for the partition. Similarly, the input vector "1010" 814 would be compressed to the index vector "11" that indexes the codeword for the partition "1111" 810.

Figure 9:
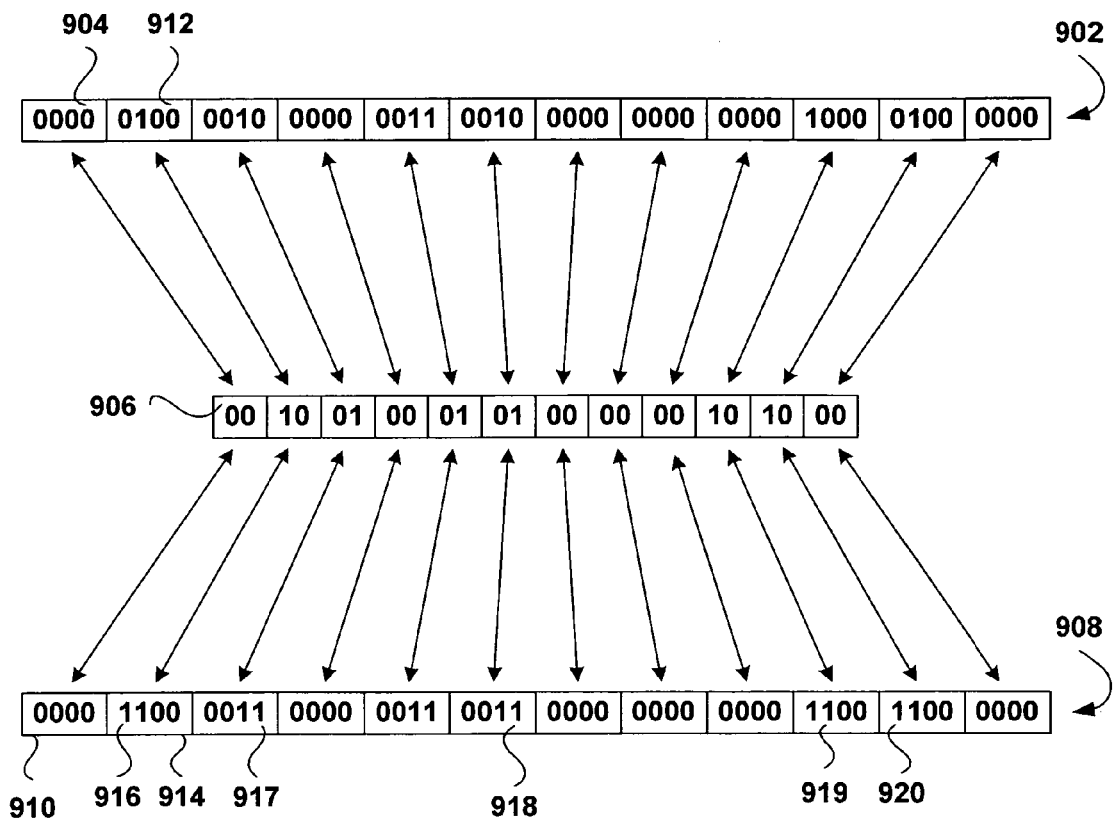

FIG. 9 illustrates compression of an example bit map by a vector-quantization compression scheme using the partitioning shown in FIG. 8. The input bit map 902 is partitioned into four-bit vectors, such as four-bit vector 904. Each input vector is then transformed into a two-bit index vector, such as two-bit index vector 906, by using the two-bit index corresponding to the codeword in the partition to which the input vector is assigned according to the scheme in FIG. 8. In general, the index corresponding to an input vector is computed using a distance or distortion metric, although, alternatively, indices for each input vector may be stored. A decompressed bit map 908 decompressed from the compressed bit map 906 is also shown in FIG. 9. Decompression is carried out by replacing each index vector with the codeword that it indexes. In certain cases, decompression produces exactly the same bit vector as originally present in the uncompressed bit map. For example, the bit vector "0000" 904 decompresses to the identical four-bit vector "0000" 910 in the decompressed bit map. However, other vectors do not exactly decompress. For example, the second bit vector 912 in the uncompressed bit map 902 decompresses to a different bit vector 914. It turns out that the bits 916–920 have changed from bit value "0" to bit value "1" through decompression, and thus represent distortion.

The vector-quantization approach used in the described embodiment of the present invention is designed to be asymmetrical in distortion, so that the value "0" may occasionally change to "1," but so that the value "1" does not change to "0" as a result of compression/decompression distortion. As a result, non-defective memory locations may be mischaracterized as defective memory locations, but defective memory locations are not mischaracterized as non-defective memory locations. An asymmetrical distortion measure is used for vector quantization of defective-memory-location tables, with the distortion of a binary value x and the decompressed form of the binary value x̂ given by:

$$d(x,\hat{x}) = \{0, \text{ when } x=\hat{x}; 1, \text{ when } x<\hat{x}; \infty \text{ when } x>\hat{x}\}$$

The efficiency and effectiveness of the vector quantization for compressing and decompressing a defective-memory-location table, described above with reference to FIGS. 4–9, depends on proper construction of the codebook of codewords. A set of training vectors, also referred to as input vectors, is commonly used in codebook construction, so that the probabilities of occurrence of various vectors are taken into account in constructing an efficient encoding of likely-to-occur vectors. Clearly, the codewords need to partition the vector space of training vectors in a way that minimizes distortion. The greater the number of codewords, the greater the number of indices necessary to index the codebook. The compression rate therefore depends on the codebook size, but, given optimal partitioning for a given set of input data, the distortion rate generally increases as the codebook size is lowered.

Figure 10:
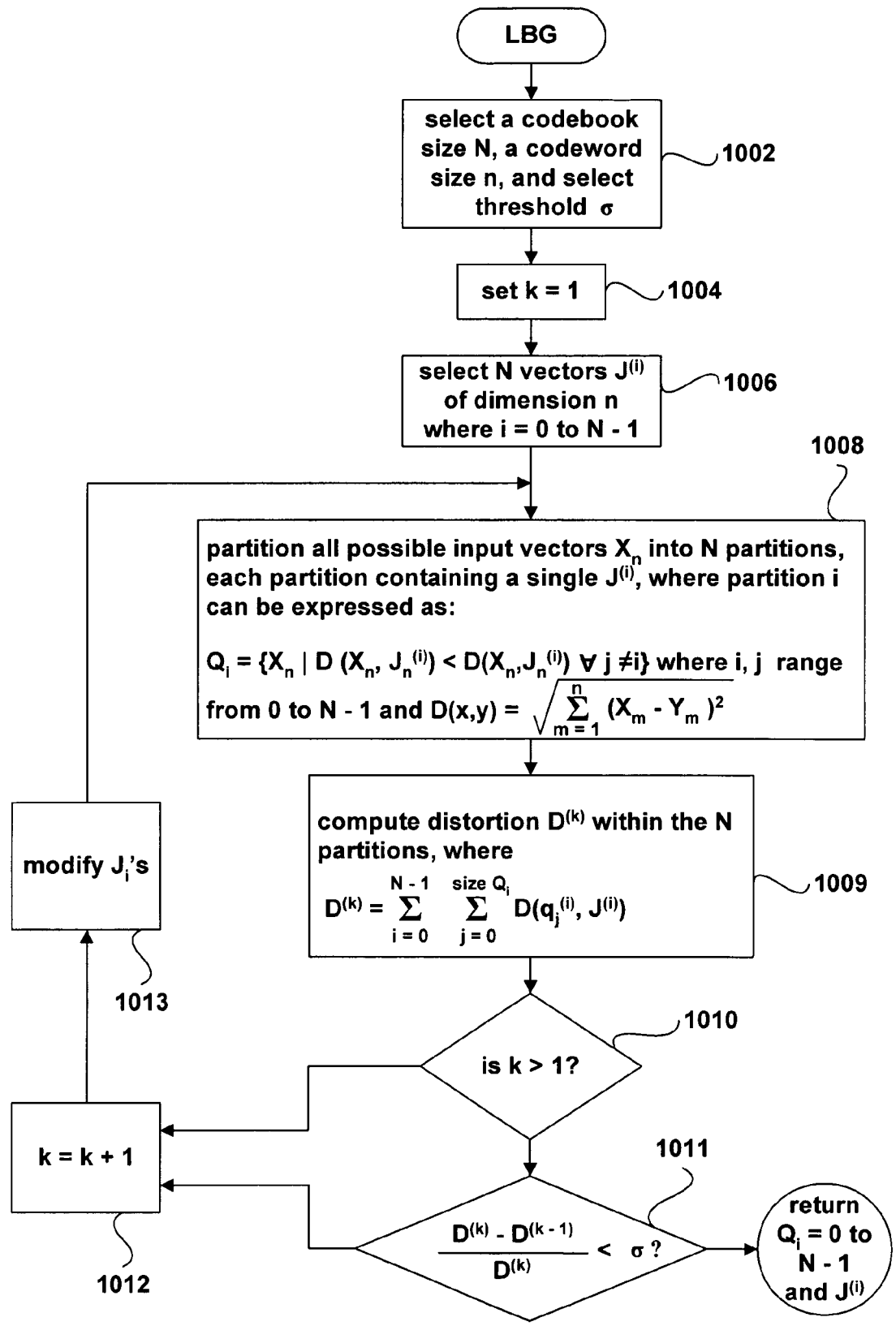
FIG. 10 is a flow-control diagram of the LBG technique for construction of a codebook.

There are a number of different approaches to constructing a codebook for vector-quantization compression/decompression. A popular technique is called the "LBG algorithm," or simply "LBG," in reference to the authors of the algorithm, Linde, Buzo, and Gray. FIG. 10 is a flow-control diagram of the LBG technique for construction of a codebook. In step 1002, a codebook size, N, a codeword vector dimension, n, and a threshold cutoff parameter 6 are selected. The codebook size N is the number of codewords, and the threshold cutoff parameter $\sigma$ is a threshold for relative change in distortion between codebooks produced by successive iterations of the LBG below which the algorithm terminates with the currently-constructed codebook. The current codebook at termination is assumed to be at least near to a local optimal codebook. Various criteria may be used to select the codebook size N and the codeword vector dimension, n. As discussed above, the compression ratio achievable by employing the codebook in vector quantization is directly related to the codebook size N. The efficiency of near-optimal codebook selection is facilitated by choosing the codeword vector dimension n to be large, providing a greater diversity in vector-space partitioning. However, when the codeword vector dimension n is chosen to be too large, it may become practically impossible to iteratively arrive at a locally optimal codebook, let alone find the optimal codebook.

In step 1004, the iteration variable k is set to 1. The iteration variable k tracks the number of times an inner loop of the LBG algorithm is executed. Then, in step 1006, the LBG algorithm selects an initial set of N n-dimensional vectors J as an initial codebook. Selection of the initial codebook can be undertaken in various different ways. One approach is to use a randomly generated set of vectors. In one random-generation approach, the index of a partition is used as the seed for a pseudorandom number generator that produces appropriately sized and appropriately distributed pseudorandom vectors. An advantage of this approach is that the codewords need not be stored. Instead, the indexes extracted from a compressed table can be input, as seeds, into the same pseudorandom number generator in order to recover the corresponding codewords. Another approach is to place each input vector into its own partition, and then coalesce partitions that are close together, in a pair-wise fashion, until an acceptably small number of partitions are generated, using the centroid vector of each partition as a codeword. A metric for closeness may be based on a sum of Euclidian distances, or may be based on alternative distance metrics. A third approach is to compute a centroid for the input vector space, use the centroid for a first codeword, and then perturb that centroid systematically to generate the remaining codewords for the initial codebook.

Steps 1008–1013 together compose an iterative loop in which the initially selected codewords are modified until an acceptable level of distortion is obtained. When the difference between the calculated distortion for the codebook constructed in the previous iteration and the distortion calculated for the current codebook falls below the threshold $\sigma$, then the LBG algorithm terminates, and the current codebook Q is returned in step 1014. The codebook consists of N partitions of input vectors, $Q_i$, where i ranges from 0 to N−1, including a codeword $J^{(i)}$ within each partition $Q_i$. In step 1008, input vectors closer to each codeword $J^{(i)}$ than to any other codeword are selected as members of the partition i that includes the codeword $J^{(i)}$, according to:

$$Q_i = \{X_n | d(X_n, J_n^{(i)}) < d(X_n, J_n^{(j)}) \forall j \neq i\}$$

where i and j $\in \{0, 1, \ldots N-1\}$ and where, for example, $$d(x, y) \equiv \sqrt{\sum_{m=1}^{n} (x_m - y_m)^2}$$

In other words, in step 1008, input vectors are partitioned into N partitions. Note that the distortion, d, may be alternatively defined to be another distortion-reflective metric, rather than a Euclidean distance. Then, in step 1009, an overall distortion $D^{(k)}$ is computed for the current codebook Q, constructed in the k-th iteration of step 1008. The overall distortion is computed as:

$$D(k) = \sum_{i=0}^{N-1} \sum_{j=1}^{sizeof(Q_i)} d(q_j^{(i)}, J^{(i)})$$

where $q_j^{(i)} \in Q_i$, $0 < j \leq sizeof(Q_i)$

In step 1010, the LBG algorithm determines whether or not k is greater than 1. If so, then a $D^{(k-1)}$ has been previously computed, and the relative distortion change, $\Delta D_{rel}^{k}$, can be calculated, in step 1011, as:

$$\Delta D_{rel}^{k} = \frac{D^{(k)} - D^{(k-1)}}{D^{(k)}}$$

The relative distortion change, $\Delta D_{rel}^{k}$ is compared to the threshold σ, in step 1011, to determine whether or not to continue searching for a better codebook. If the relative distortion change is less than the threshold σ, then the current partition and set of codewords, Q and J, respectively, are returned. Otherwise, if k is 1, or the relative distortion change is greater than σ, then the current set of codewords J is modified, in step 1013, and another iteration of the inner loop is undertaken. Again, a number of methods for modifying the codewords can be used, in step 1013. One approach is to compute a centroid vector for each partition in Q, and use the computed centroid vectors as a new set of codewords for the next iteration.

Figure 11:
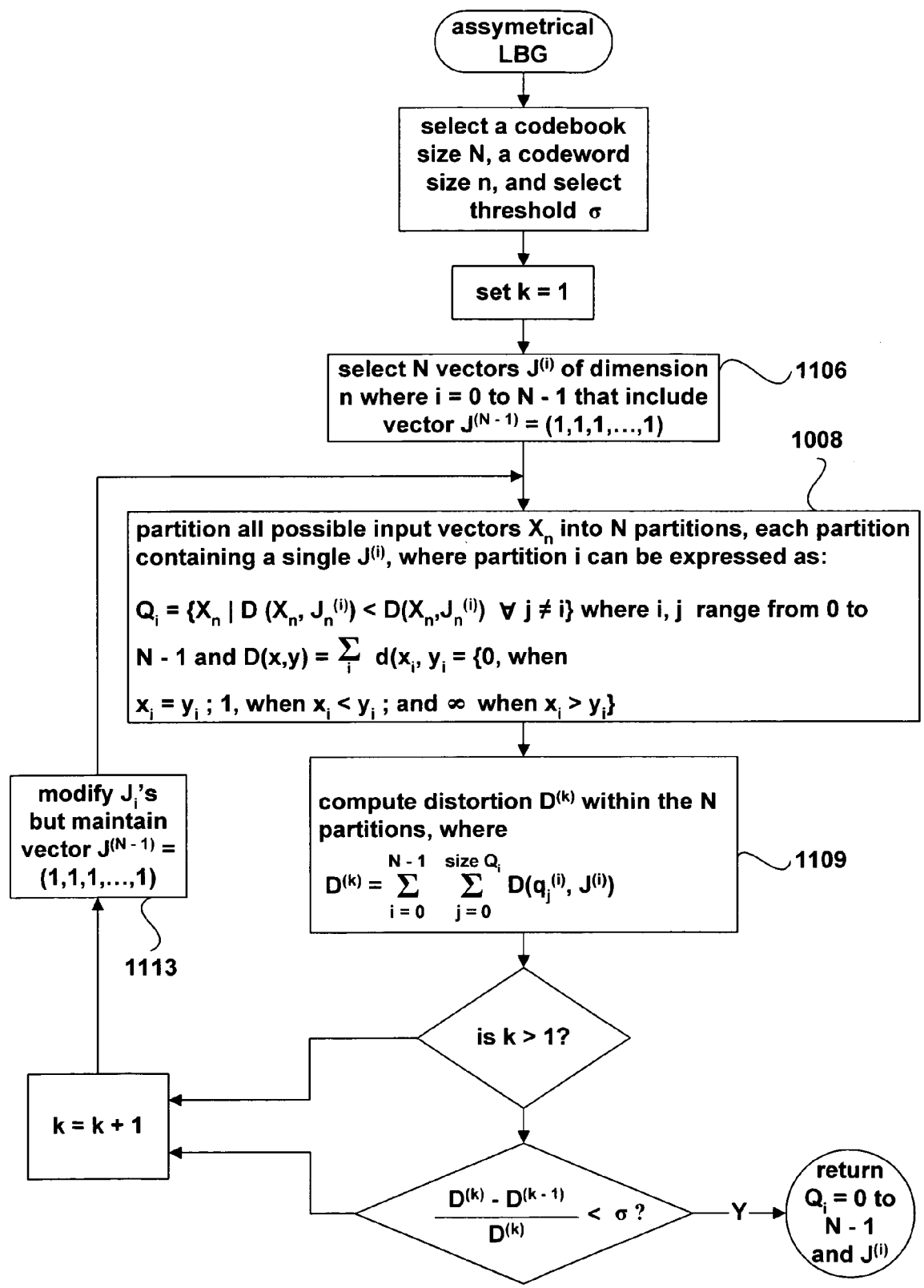
FIG. 11 is a flow-control diagram of an asymmetrical-distortion-model LBG algorithm that can be used to construct a codebook for vector-quantization defective-memory-location-table compression and decompression in an embodiment of the present invention.

The LBG algorithm needs to be tailored for use in a vector quantization scheme for compressing a defective-memory-location table. FIG. 11 is a flow-control diagram of an asymmetrical-distortion-model LBG algorithm that can be used to construct a codebook for vector-quantization defective-memory-location-table compression and decompression in an embodiment of the present invention. Many steps in the asymmetrical-distortion-model LBG algorithm are similar to those in the LBG algorithm described with reference to FIG. 10, and will not be discussed again. Instead, only the differences are discussed. The first difference is found in step 1106. Comparison of step 1106 and step 1006 in FIG. 10 reveals that, in the asymmetrical-distortion-model LBG algorithm, the initial set of vectors J must include a vector having the value "1" in each position within the vector. This vector needs to be present, to insure that, upon decompression, no "1" value is distorted into a "0" value, thereby altering an identified defective memory location to indicate that the memory location is non-defective, in the defective-memory-location table. As discussed above, with reference to FIG. 8, the only suitable codeword for an input vector consisting of "1" values in all positions is the codeword consisting of "1" values in all positions, so that codeword needs to be present in the codebook. A second difference can be found in steps 1108 and 1109, as compared with the corresponding steps 1008 and 1009 in FIG. 10. As can be seen in step 1108, rather than using a Euclidean distance measure, which reflects a symmetrical measure of distortion, the asymmetrical-distortion-model LBG algorithm employs an asymmetrical distance measure:

$$D(x, \hat{x}) = \sum_i d(x_i, \hat{x}_i)$$

where $d(x, \hat{x}) = \{0,$ when $x = \hat{x}$; 1, when $x < \hat{x}$; $\infty$ when $x > \hat{x}\}$ A third difference is found in step 1113, as compared with step 1013 in FIG. 10. When the codebook, comprising vectors J, is modified, the vector with the value "1" in all positions needs to be included in the modified codebook. Also, if the modification involves computing of centroids, or other distance-related techniques, then the above-described asymmetrical distance metric needs to be employed in place of a Euclidean distance metric. In the asymmetrical-distortion-model LBG algorithm, centroids are computed as the logical OR of the vectors in the partition.

An optimal size for a codebook can be determined through minimization of a measure of mutual information computed from the probability distribution $p_x$ of input vectors x and the conditional probability distribution $p_{\hat{x}|x}$ of decompressed vectors $\hat{x}$. As discussed above, an asymmetrical distortion measure, $D(x, \hat{x})$, is used for vector quantization of defective-memory-location tables.

In a lossy encoder/decoder, one seeks to minimize the mutual information I ($\hat{x}$; x) over the conditional probability distribution $p_{\hat{x}|x}$, where I($\hat{x}$; x) is computed from the probability distribution $p_x$ of input vectors x and the conditional probability distribution $p_{\hat{x}|x}$ of decompressed vectors $\hat{x}$, given by:

$$I(\hat{x}; x) = \sum_x \sum_{\hat{x}} p_{\hat{x}|x} p_x \left( \log_2 \frac{p_{\hat{x}|x}}{p_{\hat{x}}} \right)$$

subject to the constraint that the average distortion produced by the encoder needs to be less than or equal to a maximum allowable distortion $\mathcal{D}$:

$$\sum_x \sum_{\hat{x}} p_{\hat{x}|x} p_x D(x, \hat{x}) \leq \mathcal{D}$$

By minimizing the mutual information I($\hat{x}$; x) subject to the maximum-allowable-distortion constraint, a rate-distortion optimal rate R(δ) is obtained, with δ equal to the fraction of non-defective memory locations that can be sacrificed due to compression/decompression distortion, and δ is related to $\mathcal{D}$ as follows:

$$\mathcal{D}=n\delta(1-p)$$

where n is the vector length and p is the excepted bad sector rate. For the case of independently and identically distributed defects, the rate-distortion optimal rate is given by:

$$R(\delta)_{iid} = H(p) - ((1-p)\delta + p)H\left(\frac{p}{(1-p)\delta + p}\right)$$

where p is the defective sector rate, and
H(p) is the entropy of the defective sector rate/probability, with $H(p)=-(p)\log_2 p-(1-p)\log_2(1-p)$ The optimal size of the codebook is:

$$2^{nR(\delta)}$$

where n is the dimension of a code vector.

The optimal size for the dimension of the input and codeword vectors n may also be optimized. When the vector dimension is too small, the codebook construction may converge too quickly on a non-optimal codebook, and the effective obtainable compression rate may be too small. On the other hand, when the vector dimension is too large, the number of input vectors that need to be considered in each iteration of the asymmetrical-distortion-model LBG algorithm becomes prohibitively large, and the encoding process may become too complex. An optimal size for the dimension of the input and codeword vectors n may be determined by trial and error methods.

In order to select an effective compression/decompression method for a defective-memory-location table, it is desirable to be able to calculate a figure of merit for various compression/decompression methods, and to select the compression/decompression method that produces the best figure of merit. The best value for a figure of merit can be the least value, the greatest value, the value closest to 0, or some other value, depending on the form in which the figure of merit is expressed. A useful figure of merit for compression/decompression methods is derived, below, that produces a larger value for a more desirable compression/decompression method.

An operational rate-distortion function $R_{comp}(\delta)$ for a given compression algorithm comp is used in the derivation of the figure of merit. This function statistically or deterministically characterizes the bit rate achieved by the compression algorithm comp operating with a good-to-bad sector distortion rate of δ. The characterization may be anything from an asymptotic characterization to a worst-case characterization up to some maximum number of encoded bits. In all cases, the characterization needs to have the property that, if the compression algorithm is used to compress n bits (n being different from the previously used n representing the number of bits in a vector) with a good-to-bad sector mischaracterization rate of δ, then the compressed bitstream length should be approximately equal to $nR_{comp}(\delta)$ for all n. If the fraction of bad sectors is p, then this would correspond to $n(1-p)\delta$ mischaracterized sectors that are not used, while the number of good sectors that are actually available, according to the defect table, is $n(1-p)(1-\delta)$.

The cost considered for a lossy defect-table compression scheme involves the cost/sector of bulk storage, α, and the cost/bit of fast memory β. The cost of the total number of sectors of bulk storage, the storage for which the defect table is created and maintained, times α, plus the number of bits taken up by the table times β. The formula for the total cost C, assuming n sectors of bulk storage, is:

$$C=\alpha n+\beta n R_{comp}(\delta)$$

A compression/decompression method needs to meet a cost constraint $C_{max}$ defined as:

$$C_{max} > C$$

A compression/decompression method comp can be optimized, with respect to the distortion δ by maximizing the memory used by compressed defective-memory-location table within the cost constraint $C_{max}$, as follows:

$$\max_{\delta,n}(n(1-p)(1-\delta))$$

under the constraint:

$$C_{max} \geq \alpha n + \beta n R_{comp}(\delta)$$

Since for a fixed δ, n should be maximized to achieve equality in the constraint, this optimization can be equivalently expressed as:

$$\max_{\delta} \frac{C_{max}(1-p)(1-\delta)}{\alpha\left(1+\frac{\beta}{\alpha}R_{comp}(\delta)\right)}$$

The term $$\frac{C_{max}(1-p)}{\alpha}$$

includes only parameters specific to a particular computing environment, and can therefore be factored from the above optimization expression to give an expression for a figure of merit $F_{comp}$ for particular compression/decompression method comp as follows:

$$F_{comp}\left(p, \frac{\beta}{\alpha}\right) = \max_{\delta} \frac{(1-\delta)}{1+\frac{\beta}{\alpha}R_{comp}(\delta)}$$

or, equivalently $$F_{comp}\left(p, \frac{\beta}{\alpha}\right) = \max_{\delta} f_{comp}\left(p, \frac{\beta}{\alpha}, \delta\right)$$

where $$f_{comp}\left(p, \frac{\beta}{\alpha}, \delta\right) = \frac{(1-\delta)}{1+\frac{\beta}{\alpha}R_{comp}(\delta)}$$

The figure of merit $F_{comp}$ is thus an important tool for selecting an effective compression/decompression method. A method of employing the figure of merit $F_{comp}$ to evaluate a compression/decompression method for defective-memory-location tables represents one embodiment of the present invention.

Another approach to compression/decompression of defective-memory-location tables is to employ run-length quantization, a technique that represents yet another embodiment of the present invention. In this technique, run-length encoding is employed, but, unlike in standard run-length encoding, discussed above with reference to FIGS. 3A–C, quantized run lengths are employed, to allow for indexes to be used, rather than integers specifying the length of runs, in the compressed table. FIGS. 12 and 13 illustrate the run-length quantization compression/decompression method that represents one embodiment of the present invention. FIG. 12 shows an array L that contains run-length quanta $l_i$, where i ranges from 0 through 31, in the present example. The run-length quanta specify the sizes of runs of "0" values followed by runs of "1" values. For a given run of "0" values of length r in an uncompressed table, a quantization function Q(r) selects a run-length quantum $l_i$ such that $l_i$ is the largest quantum in L less than or equal to r. Then, the next sequence of $l_{i+1}$ values from the uncompressed table are compressed by replacing the $l_{i+1}$ values with the index of quantum $l_i$ in array L. When the index of quantum $l_i$ is decompressed, it is, in turn, replaced by a run of $l_i$ "0" values followed by a run of $(l_{i+1}-l_i)$ "1" values. More efficient compression may be obtained by using variable-length encoding of quantized run lengths.

FIG. 13 shows the run-length-quantization compression of a short, example bit string. In FIG. 13, the short, example bit string 1302 is compressed to the compressed bit string 1304, which is, in turn, decompressed to the decompressed bit string 1306. In a first step, the initial run of 1 "0" value 1308 is compressed into the 5-bit index 1310 by applying quantization function Q to the run length "1" to identify $l_1$ as the quantum corresponding to a run of length 1, which represents a single "0" value followed by $(l_2-l_1)$, or 1, "1" value. Of course, this first $l_1$-based compression actually results in an expansion, and would generally not be used in an actual system. In a next step, a run of 10 "0" values, beginning with "0" value 1312, is replaced with L-array index "4" 1314 corresponding to $l_4$. This represents a run of 10 "0" values followed by a run of $(l_5-l_4)$, or 4, "1" values. Finally, a run of 12 "0" values is also replaced with L-array index "4" 1318 corresponding to $l_4$.

Decompression involves identifying each L-array index i, and replacing the L-array index with $l_i$ "0" values followed by a run of $(l_{i+1}-l_i)$ "1" values. As shown in FIG. 13, distortion may occur. The "1" values 1320–1324 in the decompressed bit string 1306 were originally "0" values, in the uncompressed bit string 1302. Thus, run-length quantization represents a lossy compression with an asymmetrical distortion, as in the case of vector quantization.

If run-lengths r of non-defective blocks occur randomly according to the probability distribution p(r), then the average or expected good-to-bad-sector-mislabeling rate produced by using a partitioning $$\Pi = \bigcup_{i=0}^{k-1} C_i,$$

where $C_i$ represents one of k intervals $C_i=[l_i, \ldots, l_{i+1}-1]$, is proportional to:

$$D(\Pi) = \sum_{i=0}^{k-1} \sum_{r=l_i}^{l_{i+1}-1} p(r)((r-l_i) + (1-p)(l_{i+1}-r-1))$$

where p is the expected rate of defective sectors. An optimal partitioning can be found by reducing the problem to one of finding the shortest path on a directed graph. Every vertex in the graph is labeled by an integer that represents a possible cell boundary. The vertex i is connected to every vertex j>i by an edge $e_{i,j}$ that represents the cell [i,j−1] that is labeled with the contribution of the cell to the expected overall distortion. Finding the shortest possible path in this graph is equivalent to finding the minimum cost partition and, thus, the optimal quanta for the quantized run-length compression/decompression method. This design algorithm works only for fixed-length encoding of quantized runs, but can be extended to variable-length encoding by incorporating −λp $(C_i)\log(p(C_i))$ into the cost of each edge spanning a partition, where $p(C_i)$ is the sum of p(r) for r falling through to partition $C_i$.

Figure 14:
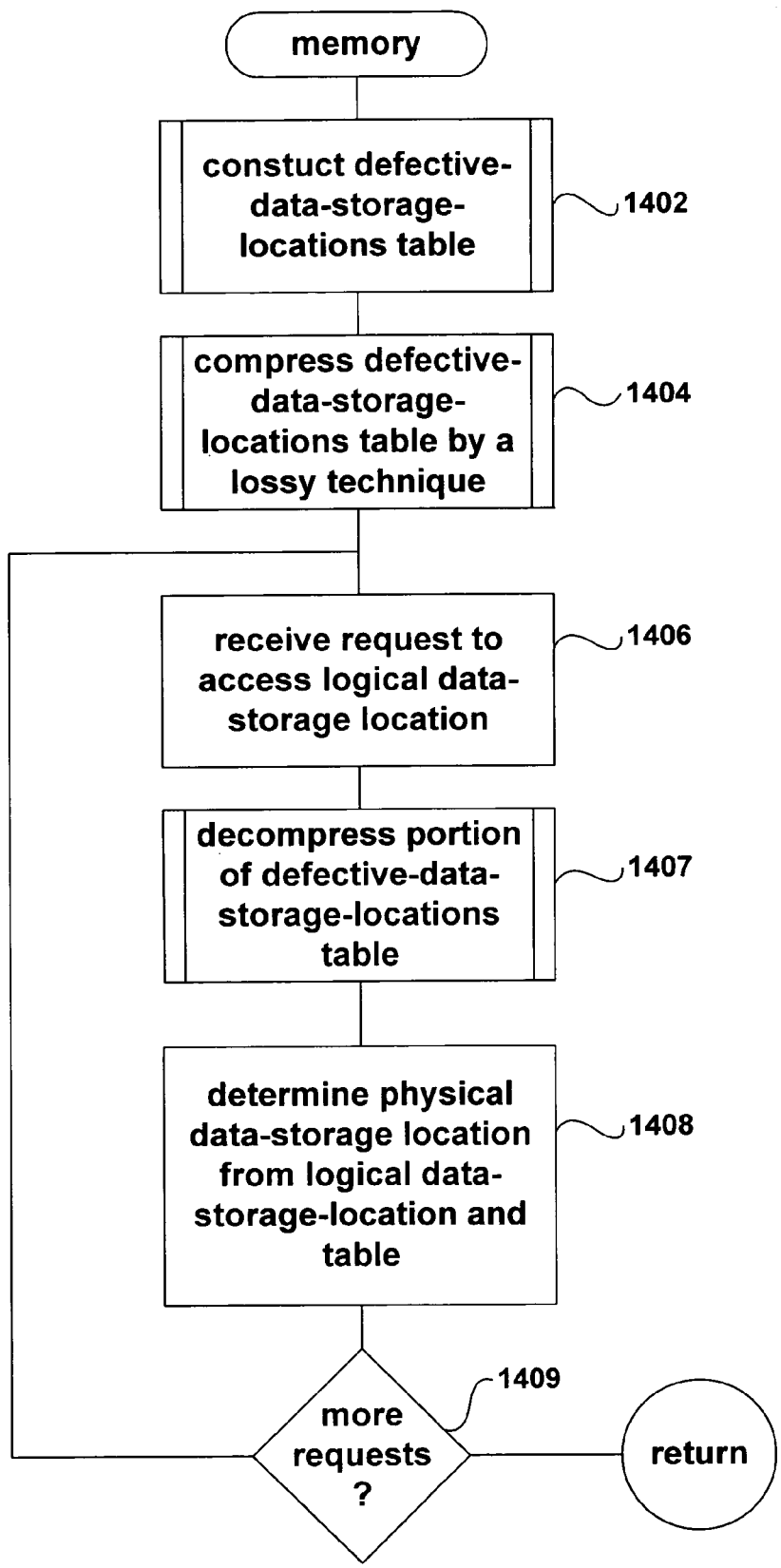
FIGS. 14 and 15 provide, in flow-control-diagram format, an overview of a method for providing memory incorporating one of the described embodiments of the present invention.
Figure 15:
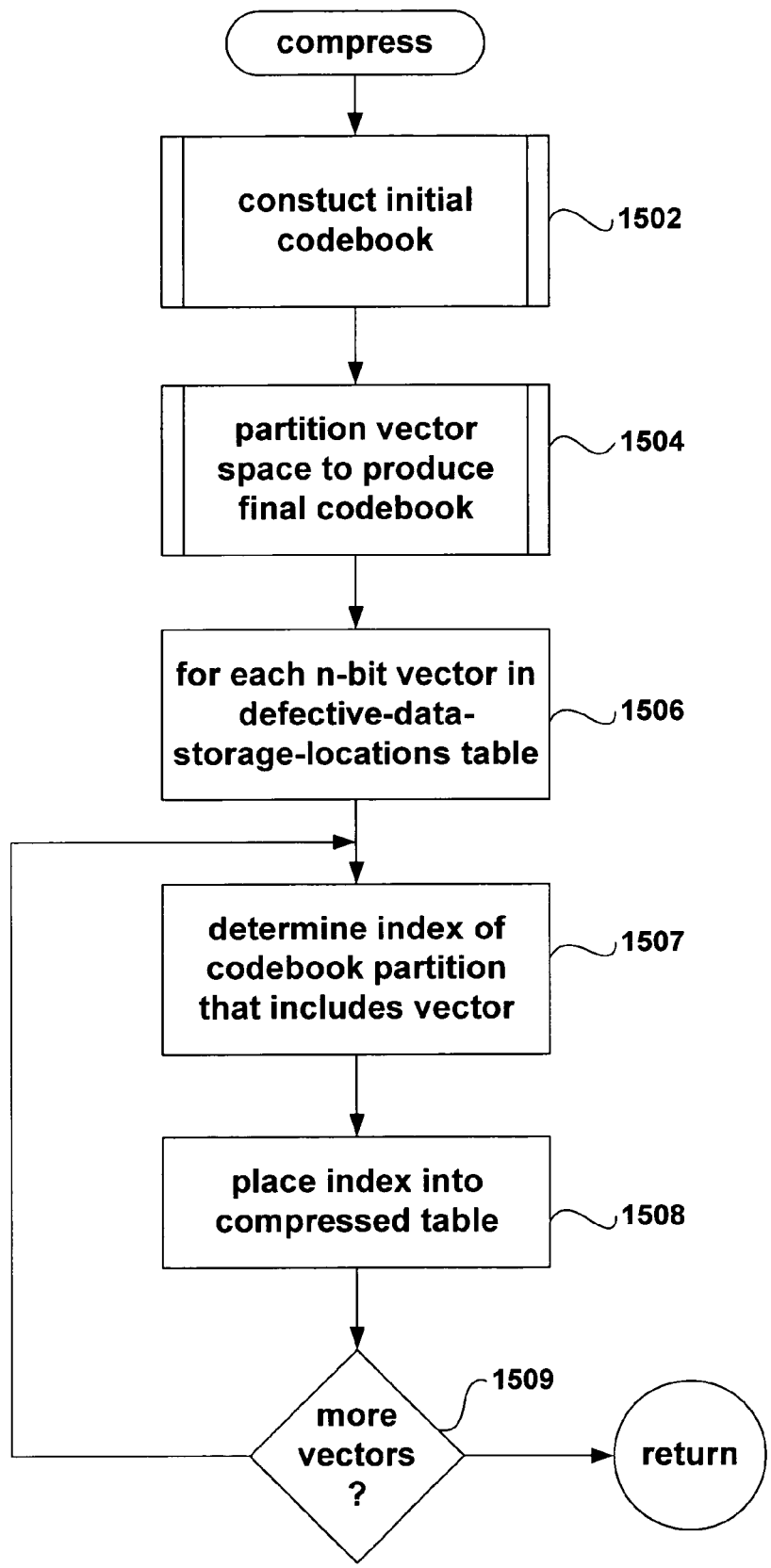

FIGS. 14 and 15 provide, in flow-control-diagram format, an overview of a method for providing memory incorporating one of the described embodiments of the present invention. FIG. 14 illustrates a general method for providing a memory incorporating a defective-data-storage-locations table compressed according to one of the described embodiments of the present invention. In step 1402, a defective-data-storage-locations table is constructed. As discussed above, a bit-map implementation is convenient for a defective-data-storage-locations table, with each bit representing a data-storage location. A data-storage location may be a disk block or disk sector, for example, or one or more nanowire-array junctions in a nanowire-based memory, as another example. In step 1404, the defective-data-storage-locations table is compressed using a lossy compression technique, such as one of the lossy techniques discussed above. Note that lossy compression techniques do not include, with respect to the present invention, simple changes in granularity of the defective-data-storage-locations table, such as using a single bit to represent a disk sector rather than a disk block. Then, in the loop comprising steps 1406-1409, logical data-storage-location access requests are fielded and handled. A sufficient portion of the defective-data-storage-locations table is decompressed, in step 1407, in order to determine a corresponding physical data-storage location corresponding to the requested logical data-storage location, and the physical data-storage location is used to retrieve data from, or write data to, the data-storage location.

FIG. 15 illustrates a lossy compression method invoked in step 1404 of FIG. 14. In step 1502, an initial codebook is constructed, in which a codeword is selected for each of a number of partitions, as discussed above. In step 1504, the vector space of vectors into which the defective-data-storage-locations table is decomposed is partitioned to produce a final codebook. Then, in the for-loop comprising steps 1506–1509, the defective-data-storage-locations table is decomposed into fixed-length vectors, and, for each fixed-length vector, the index of the codebook partition containing the vector is retrieved from the codebook and added to the compressed table, as discussed above.

Although the present invention has been described in terms of a particular embodiment, it is not intended that the invention be limited to this embodiment. Modifications within the spirit of the invention will be apparent to those skilled in the art. For example, as discussed above, the figure of merit for comparing the efficiency of various defective-memory-location-table compression/decompression methods may be mathematically recast to indicate greater efficiency by producing values closer to 0, or smaller in magnitude, rather than by producing larger values. Various alternative figure of merit may be obtained by including additional or different constraints and maximizing efficiency with respect to different parameters. While vector quantization and run-length quantization methods are found to be very efficient and useful for many defective-memory-location distributions, other compression/decompression methods may be identified that are more useful for other defective-memory-location distributions. Variations in these methods are possible, including variations in implementation, language and style of implementation, treatment of boundary conditions, codebook structure, data structures, the sense and meaning of particular bit values, and many other such variations. In general, each memory-location access requires decompression of a compressed defective-memory-location table in order to determine the physical address of the accessed memory location. However, it may be possible to compress the table in segments, and provide an index into those segments, to allow decompression of only a relevant portion of the table, rather than requiring the entire table to be decompressed.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A method for providing an ordered sequence of non-defective data-storage locations, the method comprising:
   constructing a defective-data-storage-locations table;
   compressing, by means of lossy compression, the defective-data-storage-locations table into a compressed defective-data-storage-locations table by a lossy compression method other than changing a data-storage-location size to which defective-data-storage-locations-table entries correspond; and
   when a data-storage location is accessed by a logical address, decompressing a sufficient portion of the defective-data-storage-locations table in order to determine a physical location of the logically addressed data-storage location.

2. The method of claim 1 wherein decompressing said sufficient portion of the defective-data-storage-locations table in order to determine said physical location of the logically addressed data-storage location further includes: extracting indexes from the compressed defective-data-storage-locations table; and inserting, for each extracted index, a codeword associated with the index in a codebook into a decompressed defective-data-storage-locations table.

3. The method of claim 2 wherein compressing the defective-data-storage-locations table further includes:
   providing a quantization function Q that, for a run of identical bit values of length r, returns a quantum $l_i$ equal to or less than r from an ordered set L of quanta that strictly increase in magnitude with increasing position i within the ordered set L;
   successively extracting a run of identically valued bits from the defective-data-storage-locations table starting at position j within the defective-data-storage-locations table, with the initial value of j equal to 0, and, for each extracted run of identically valued bits
       applying the quantization function Q to the length of the extracted run to select a quantum $l_i$ corresponding to the length of the run,
       placing the index i into the compressed defective-data-storage-locations table; and
       advancing j by $l_{i+l}$ positions.

4. The method of claim 3 wherein decompressing said sufficient portion of the defective-data-storage-locations table in order to determine said physical location of the logically addressed data-storage location further includes: extracting indexes from the compressed defective-data-storage-locations table; for each extracted index i, placing into said decompressed defective-data-storage-locations table a quantum of li identically valued bits followed by a quantum difference of $(l_t+i-l_i)$ oppositely valued bits.

5. The method of claim 1 wherein the defective-data-storage-locations table comprises a bit map in which each bit indicates whether or not a corresponding physical data-storage location is defective.

6. The method of claim 5 wherein compressing the defective-data-storage-locations table and storing the compressed defective-data-storage-locations table further includes:
   constructing an initial codebook comprising a set of codewords, each codeword a bit vector having a length of n bits;
   partitioning input vectors into discrete partitions, each partition including a single codeword, and one partition including a codeword comprising n bit values indicating defective memory locations, to produce a codebook; and
   extracting successive input vectors having lengths of n bits from the defective-data-storage-locations table and placing into the compressed defective-data-storage-locations table, for each extracted input vector, an index of the codeword within a codebook partition that includes the extracted input vector.

7. The method of claim 6 wherein placing into the compressed defective-data-storage-locations table, for each extracted input vector, an index of the codeword within said codebook partition that includes the extracted input vector further includes determining the codebook partition that includes the extracted input vector by one of: a table lookup; computing the codebook partition using a distance metric; and computing the codebook partition using a distortion metric.

8. The method of claim 7 wherein constructing said codebook comprising a set of codewords further includes using a asymmetrical-distortion-model LBG algorithm by which an initially selected set of codewords is iteratively modified.

9. The method of claim 8 wherein the total distortion is computed as a sum of distortions within each partition of each input vector with respect to the codeword for the partition.

10. The method of claim 9 wherein the distortion D between an input vector $\hat{x}$ and a codeword x is determined as an asymmetric distortion $$D(x, \hat{x}) = \sum_i d(x_i, \hat{x}_i)$$

where $$d(x,\hat{x}) = \{0, \text{ when } x=\hat{x}; 1, \text{when } x<\hat{x}; \infty \text{ when } x>\hat{x}\}.$$

11. The method of claim 6 wherein constructing said codebook comprising a set of codewords further includes randomly generating the codewords according to a probability distribution.

12. The method of claim 11 further including using each index of each partition as a seed for a pseudorandom number generator to produce codewords.

13. The method of claim 12 wherein decompressing said sufficient portion of the defective-data-storage-locations table in order to determine said physical location of the logically addressed data-storage location further includes: extracting indexes from the compressed defective-data-storage-locations table; supplying each extracted index to the pseudorandom number generator to produce corresponding decompressed codewords; and inserting the decompressed codewords into said decompressed defective-data-storage-locations table.

14. A memory comprising:
a memory device with physical memory locations; and
a defective-memory-locations table that is compressed by a lossy compression method designed to produce asymmetrical data distortion and that is decompressed upon access of a logical memory location within the memory device in order to map the logical memory location to a physical memory location, the asymmetrical data distortion preventing identification of a bad memory location as a good memory location due to distortion produced by compression and decompression of the defective-memory-locations table.

15. The memory of claim 14 wherein the defective-memory-locations table comprises a bit map in which each bit indicates whether or not a corresponding physical memory location is defective.

16. The memory of claim 15 wherein the compressed defective-memory-locations table comprises indexes of codewords within a codebook, a single codeword within each of a number of partitions comprising a codeword and additional input vectors.

17. The memory of claim 16 wherein each codeword and input vector is a bit vector having a length of n bits, wherein input vectors are successively extracted from an initial, uncompressed defective-memory-locations table.

18. The memory of claim 15 wherein the compressed defective-memory-locations table comprises indexes of quanta within an ordered set L of quanta that strictly increase in magnitude with increasing position i within the ordered set L.

* * * * *

UNITED STATES PATENT AND TRADEMARK OFFICE
CERTIFICATE OF CORRECTION

PATENT NO.        : 7,013,378 B2
APPLICATION NO. : 10/427526
DATED             : March 14, 2006
INVENTOR(S)       : Giovanni Motta et al.

It is certified that error appears in the above-identified patent and that said Letters Patent is hereby corrected as shown below:

In column 8, line 12, delete "6" and insert -- $\sigma$ --, therefor.

In column 16, line 29, in Claim 4, delete "li" and insert -- $l_i$ --, therefor.

In column 16, line 30, in Claim 4, delete "$(l_i+i-l_i)$" and insert -- $(l_{i+1} - l_i)$ --, therefor.

Signed and Sealed this

Twenty-seventh Day of October, 2009

David J. Kappos
*Director of the United States Patent and Trademark Office*